(12) United States Patent
Chi

(10) Patent No.: US 8,922,244 B2
(45) Date of Patent: Dec. 30, 2014

(54) THREE DIMENSIONAL INTEGRATED CIRCUIT CONNECTION STRUCTURE AND METHOD

(71) Applicant: Taiwan Semiconductor Manufacturing Company, Ltd., Hsinchu (TW)

(72) Inventor: Shyh-An Chi, Hsinchu (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 0 days.

(21) Appl. No.: 14/168,297

(22) Filed: Jan. 30, 2014

(65) Prior Publication Data
US 2014/0145757 A1    May 29, 2014

Related U.S. Application Data

(63) Continuation of application No. 13/296,996, filed on Nov. 15, 2011, now Pat. No. 8,669,780.

(60) Provisional application No. 61/553,539, filed on Oct. 31, 2011.

(51) Int. Cl.
| H03K 19/177 | (2006.01) |
| H03K 19/173 | (2006.01) |
| H03K 19/0175 | (2006.01) |
| H01L 25/065 | (2006.01) |

(52) U.S. Cl.
CPC .. *H03K 19/017581* (2013.01); *H03K 19/17736* (2013.01); *H01L 2225/06517* (2013.01); *H01L 2225/06541* (2013.01); *H01L 2225/06527* (2013.01); *H01L 2224/16* (2013.01); *H01L 25/0657* (2013.01); *H01L 2225/06513* (2013.01)
USPC ................. 326/41; 326/38; 326/39

(58) Field of Classification Search
USPC .................. 326/37–41, 46, 47; 257/773, 777; 365/63
See application file for complete search history.

(56) References Cited

U.S. PATENT DOCUMENTS

| 5,498,975 | A | 3/1996 | Cliff et al. |
| 7,835,207 | B2 | 11/2010 | Keeth et al. |
| 2008/0150579 | A1 | 6/2008 | Madurawe |
| 2010/0085825 | A1 | 4/2010 | Keeth et al. |
| 2011/0108972 | A1 | 5/2011 | Foster et al. |
| 2011/0110064 | A1 | 5/2011 | Foster et al. |
| 2011/0110065 | A1 | 5/2011 | Foster et al. |
| 2012/0007624 | A1* | 1/2012 | Byeon et al. ............. 324/750.15 |
| 2012/0124532 | A1* | 5/2012 | Coteus et al. ................. 716/104 |
| 2012/0256653 | A1 | 10/2012 | Cordero et al. |

FOREIGN PATENT DOCUMENTS

| JP | 2008-515202 | 5/2008 |
| JP | 2011-160009 | 8/2011 |
| WO | WO 97/36466 | 10/1997 |
| WO | WO 2006/039254 | 4/2006 |

* cited by examiner

*Primary Examiner* — Daniel D Chang
(74) *Attorney, Agent, or Firm* — Lowe Hauptman & Ham, LLP

(57) ABSTRACT

An integrated circuit die stack comprises a first die and a second die connected to each other. Each of the first and second dies comprise a functional circuitry, a plurality of first contacts on a first surface of the respective die, a plurality of second contacts on a second surface of the respective die, and a programmable array coupled to the functional circuitry and the plurality of first and second contacts. The programmable array includes a plurality of programmable connection elements in the first and second dies. The programmable connection elements are programmed to bypass one of the first and second dies.

21 Claims, 8 Drawing Sheets

THREE DIMENSIONAL INTEGRATED CIRCUIT CONNECTION STRUCTURE AND METHOD

PRIORITY CLAIM

The present application is a continuation of U.S. application Ser. No. 13/296,996, filed Nov. 15, 2011, which claims priority of U.S. Provisional Application No. 61/553,539, filed Oct. 31, 2011, which are incorporated herein by reference in their entireties.

FIELD OF DISCLOSURE

The present disclosure relates to semiconductor integrated circuits (IC) generally, and more particularly to packages including stacked dies, also referred to as 3D ICs.

BACKGROUND

With the progress in technology of die manufacturing and packaging, three-dimensional integrated circuits (3DICs) have been developed, in which two or more symmetrical or asymmetrical dies are integrated vertically and horizontally in a single package. In order to transmit corresponding signals from a lower level of die to a higher level of die in 3DIC stacking package, a signal routing mechanism should be provided for correct signal transmission in a stacked multi-die package.

DETAILED DESCRIPTION

Figure 1A:
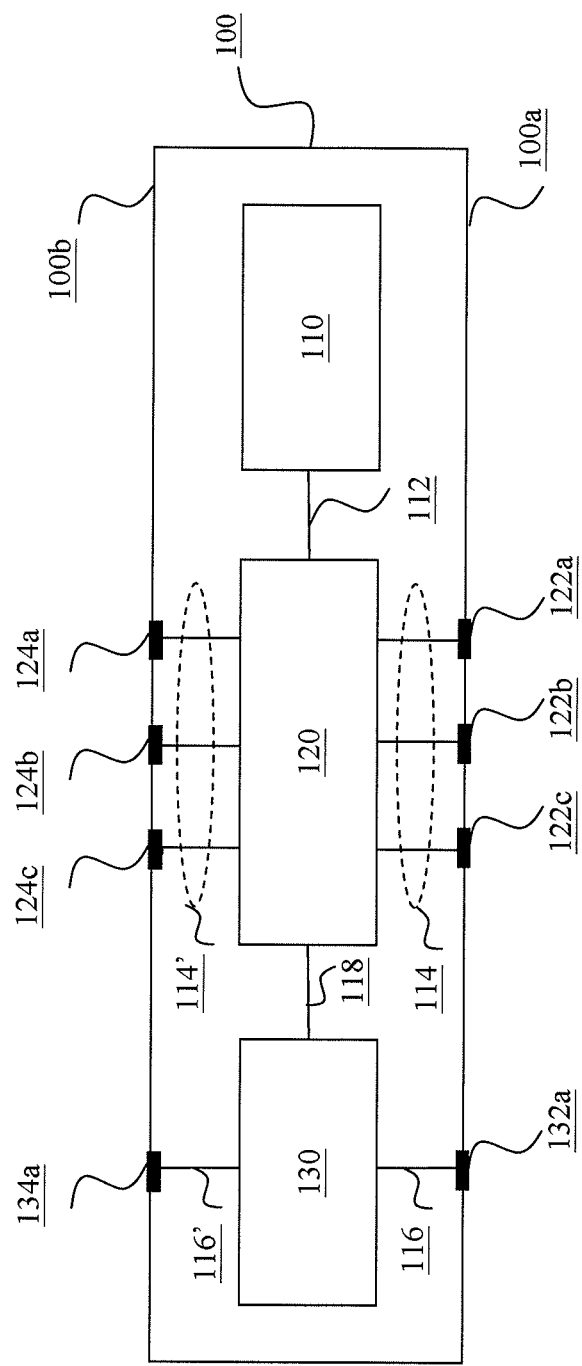
FIG. 1A illustrates a schematic diagram of a die in accordance with some embodiments.

The making and using of the embodiments of the disclosure are discussed in detail below. It should be appreciated, however, that the embodiments provide many applicable inventive innovations that can be embodied in a wide variety of specific contexts. The specific embodiments discussed are merely illustrative, and do not limit the scope of the disclosure.

This description of the exemplary embodiments is intended to be read in connection with the accompanying drawings, which are to be considered part of the entire written description. In the description, relative terms such as "lower," "upper," "horizontal," "vertical," "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, unless expressly described otherwise.

With reference to FIG. 1A, die 100 illustrates a schematic diagram of a die, according to an example embodiment of the present work. The die 100 includes a functional circuitry 110, a programmable array 120, a programmable array control unit 130. At lower surface 100a, die 100 contains contacts 122a, 122b, 122c, and 132a for external connections. Similarly, at upper surface 100b, die 100 also contains contacts 124a, 124b, 124c, and 134a for external connections. Although FIG. 1A only shows a certain number of contacts per die, it is understood that this is for ease of illustration, and any number of contacts may be used, depending on the functional requirements of the die and the die stack. The contacts at the lower and upper surface of the die 100 are coupled to the programmable array 120 and the programmable array control unit 130 through electrical connections 114, 114', 116 and 116'. The contacts at the lower and upper surface of the die 100 may be solder pads, solder bumps, copper pillar bumps or the like for coupling with adjacent die(s) or substrate(s). The electrical connection 114, 114', 116 and 116' may be any form of interconnection, such as metal, via, Through Substrate Vias (TSVs), or any conductor made of other materials.

The functional circuitry 110 is a circuit block, for example memory and/or logic circuitries, that may be launched to carry out specific functionalities, for example, a general processor, a graphic processor, an audio/video decoder, a global positioning satellite (GPS) receiver, or the like. The functional circuitry 110 may have more than one input or output signal. However, in FIG. 1A one input/output signal, electrical connection 112 is used to simplify illustration. The electrical connection 112 may be any form of interconnection, such as metal, via, TSVs, or any conductor made of other materials.

Referring again to FIG. 1A, the programmable array 120 is coupled to the functional circuitry 110, the programmable array control unit 130, contacts 122a, 122b, 122c and contacts 124a, 124b, 124c. The number of contacts connected to the programmable array 120 at the lower surface 100a may be the same as the number of contacts connected to the programmable array 120 at the upper surface 100b. In some embodiments, the number of contacts connected to the programmable array 120 at the lower surface 100a may not be the same as the number of contacts connected to the programmable array 120 at the upper surface 100b. The programmable array 120 comprises a plurality of programmable circuits for selectively creating signal routes between electrical connections 112 and 114, and/or between electrical connections 114 and 114'. The programmable circuits may comprise transmission gates, electrical fuses, or any other circuits. In operation, the programmable array 120 is programmed to electrically connect one of the contacts 122a, 122b, or 122c with electrical connection 112, and/or to electrically connect another one of the contacts 122a, 122b, or 122c with a corresponding one of contacts 124a, 124b or 124c.

Referring again to FIG. 1A, the programmable array control unit 130 is coupled to the programmable array 120, contact 132a and 134a. Although FIG. 1A only shows two contacts are coupled to the programmable array control unit 130, it is understood that this is for ease of illustration, and any number of contacts may be used, depend on the functional requirements of the die and the die stack. The programmable array control unit 130 is a mechanism to program the programmable array 120. To enable the programming, some signals generated by a Finite State Machine (FSM) or a control circuit are transmitted to the programmable array control unit 130 through contact 132a from adjacent dies or substrate. The FSM or the control circuit may be located within a substrate or other dies mounted on the substrate. In some embodiments, after performing logical and/or arithmetic operations on the signals, the processed results are transmitted to the programmable array 120 through an electrical connection 118 and to adjacent dies through the contacts 134a. In some embodiments, the logical operations performed on the signals may be AND, OR, NAND, NOR, XOR, XNOR, INV, shifting, rotating etc, and the arithmetic operations may be addition, subtraction, multiple, division, etc.

Figure 1B:
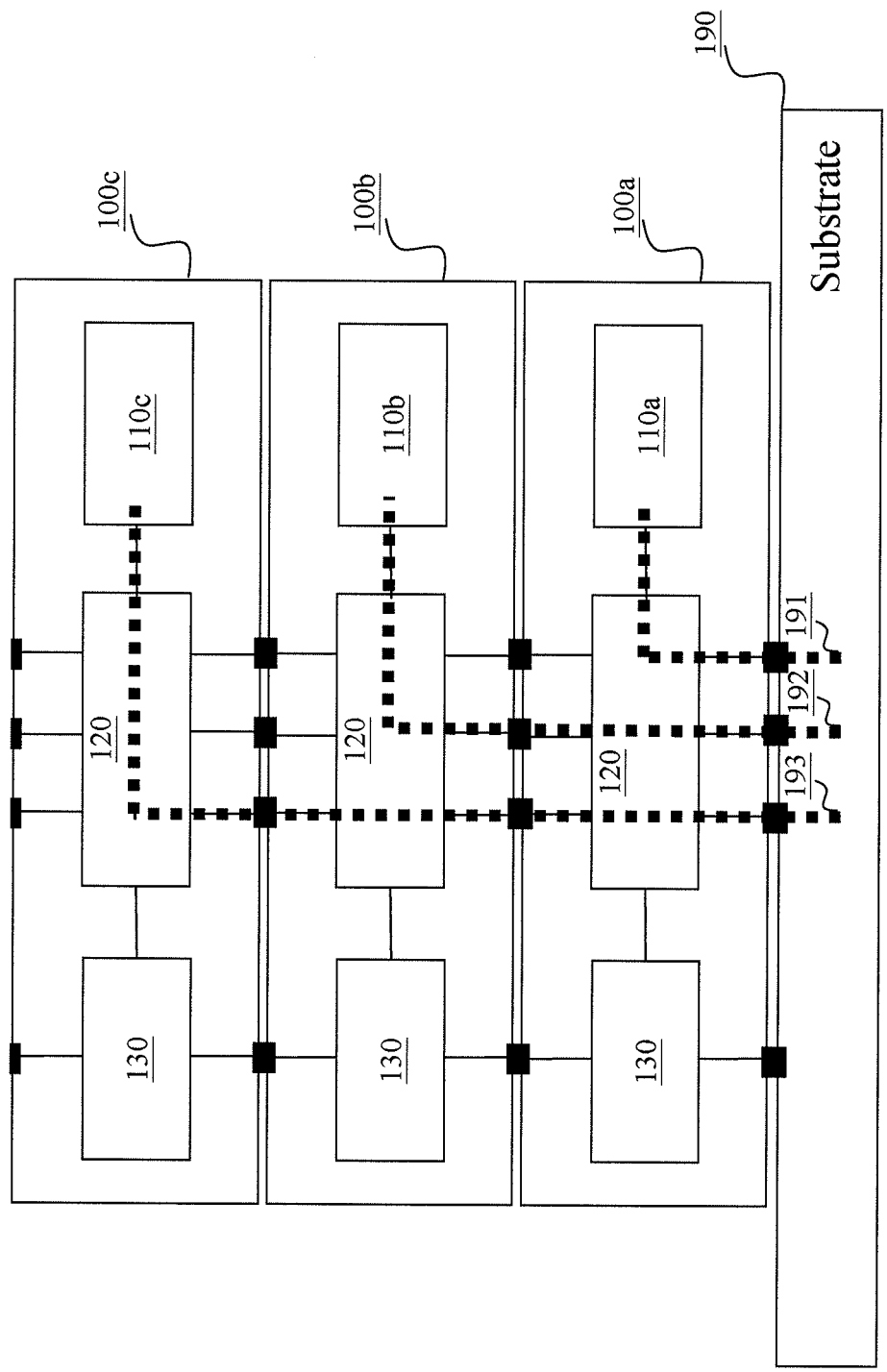
FIG. 1B illustrates signal routes to corresponding functional circuitry in stacked-die architecture in accordance with some embodiments.

FIG. 1B diagrammatically illustrates the signal routes to corresponding functional circuitry in stacked-die architecture according to an example embodiment of the present work. Dies 100a, 100b and 100c are similar to the die 100 illustrated in FIG. 1A, and are stacked upon one another and upon a substrate 190. In some embodiments, the substrate 190 may provide a connection between the die stack and external contacts, formed of materials such as semiconductor materials, dielectric materials, or the like. In various embodiments the substrate 190 may be a printed circuit board (PCB), an integrated circuit carrier board, or any other boards.

Although FIG. 1B only shows three dies 100a, 100b and 100c stacked on the substrate 190, it is understood that this is for ease of illustration, and any number of dies may be used, depending on the functional requirements of the die stack. Signals on signal routes 191, 192, 193 may be generated by circuits located in the substrate or other dies mounted on the substrate. Signal route 191 is electrically connected to a functional circuitry 110a of die 100a. Signal route 192 is electrically connected to a functional circuitry 110b of die 100b. Signal route 193 is electrically connected to a functional circuitry 110c of die 100c. To enable the connection, the programmable array control unit 130 in each dies 100a, 100b and 100c is triggered to program a corresponding programmable array 120 to provide dedicated signal routes. For example, in the die 100a, the corresponding programmable array 120 is programmed to provide electrical connections between contacts in the lower surface of the die 100a to the functional circuitry 110a. In addition, the corresponding programmable array 120 is also programmed to provide electrical connections between contacts in the lower surface of the die 100a to contacts in the upper surface of the die 100a.

Figure 2A:
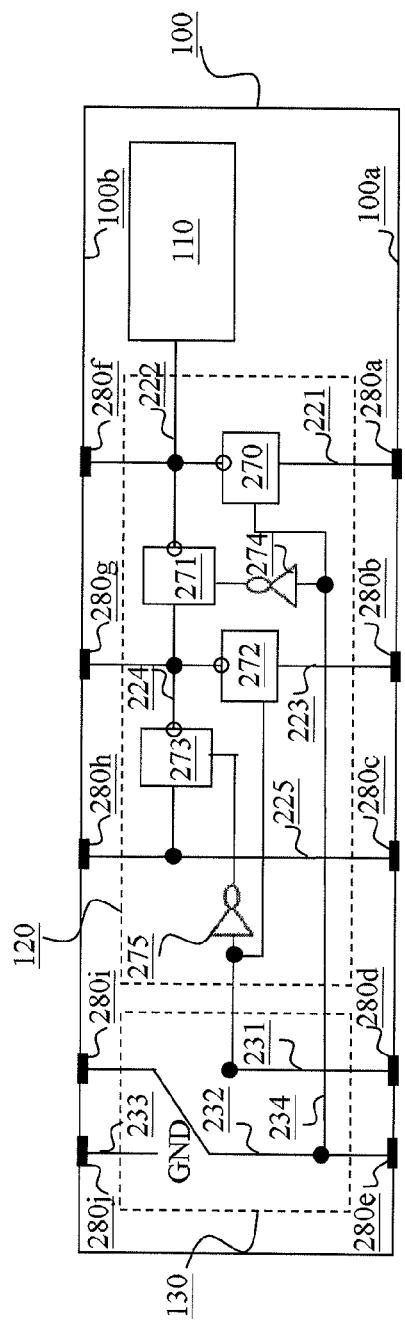
FIG. 2A is a schematic view of an integrated circuit die in accordance with some embodiments.

FIG. 2A sets forth a schematic view of an integrated circuit die 100 according to an example embodiment of the present work. The die 100 contains functional circuitry 110, programmable array 120, and programmable array control unit 130. Furthermore, the die 100 also comprises contacts 280a, 280b, 280c, 280d, and 280e at a lower surface 100a of the die 100, and contacts 280f, 280g, 280h, 280i, and 280j at an upper surface 100b of the die 100.

Figure 2B:
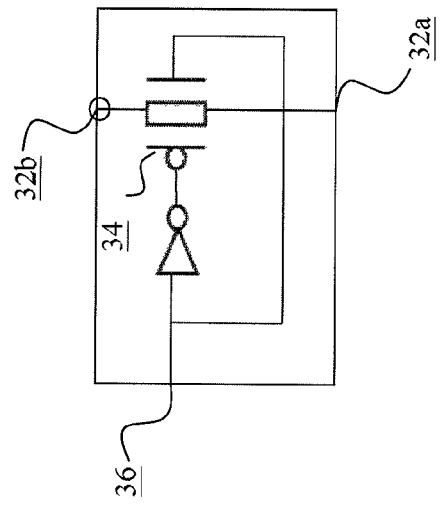
FIG. 2B is a schematic view of a programmable connection element in accordance with some embodiments.

The programmable array 120 in the dies 100 contains programmable connection elements 270, 271, 272, and 273, and inverters 274, 275. A schematic of a programmable connection element is shown in FIG. 2B according to an example embodiment of the present work. In FIG. 2B, a transmission gate 34 is used to connect electrical ports 32a and 32b, with the switch control from electrical port 36. The programmable connection element in FIG. 2B is activated to electrically connect the electrical port 32a to the electrical port 32b when the electrical port 36 received a logical high voltage, for example an operation voltage; and it is disabled to electrically disconnect the electrical port 32a from the electrical port 32b when the electrical port 36 received a logical low voltage, for example a ground voltage.

In the die 100 shown in FIG. 2A, an electrical connection 221 connects the contact 280a to the port 32a shown in FIG. 2B of the programmable connection element 270. For clarity, ports indicated by a circle for programmable connection elements 270 and 272 in FIGS. 2A, 3, 5, 6 and 7, and programmable connection elements 271 and 273 in FIGS. 2A, 3 correspond to port 32b shown in FIG. 2B. The ports positioned on opposite side of programmable connection elements 270 and 272 in FIGS. 2A, 3, 5, 6 and 7, and programmable connection elements 271 and 273 in FIGS. 2A, 3 correspond to port 32a shown in FIG. 2B and the remaining port corresponds to port 36 shown in FIG. 2B. Furthermore, an electrical connection 222 connects to the port 32b shown in FIG. 2B of the programmable connection element 270, the port 32b shown in FIG. 2B of the programmable connection element 271, the contact 280f and the functional circuitry 110. An electrical connection 223 connects the contact 280b to the port 32a shown in FIG. 2B of the programmable connection element 272. An electrical connection 224 connects to the port 32a shown in FIG. 2B of the programmable connection element 271, the port 32b shown in FIG. 2B of the programmable connection elements 272, 273 and the contact 280g. An electrical connection 225 is connected the contact 280c to the port 32a shown in FIG. 2B of the programmable connection element 273 and the contact 280h.

The programmable array control unit 130 in the die 100 contains electrical connection 231, 232, and 233. The electrical connection 231 connects the contact 280d to the input of the inverter 275 and the electrical port 36 of the programmable connection element 272; and the output of the inverter 275 connects to the electrical port 36 shown in FIG. 2B of the programmable connection element 273. The electrical connection 232 connects the contact 280e to the contact 280i, the input of the inverter 274 and the electrical port 36 shown in FIG. 2B of the programmable connection element 270; and the output of the inverter 274 connects to the electrical port 36 shown in FIG. 2B of the programmable connection element 271. The electrical connection 233 connects the contact 280j to a logical low voltage, such as a ground voltage.

Figure 3:
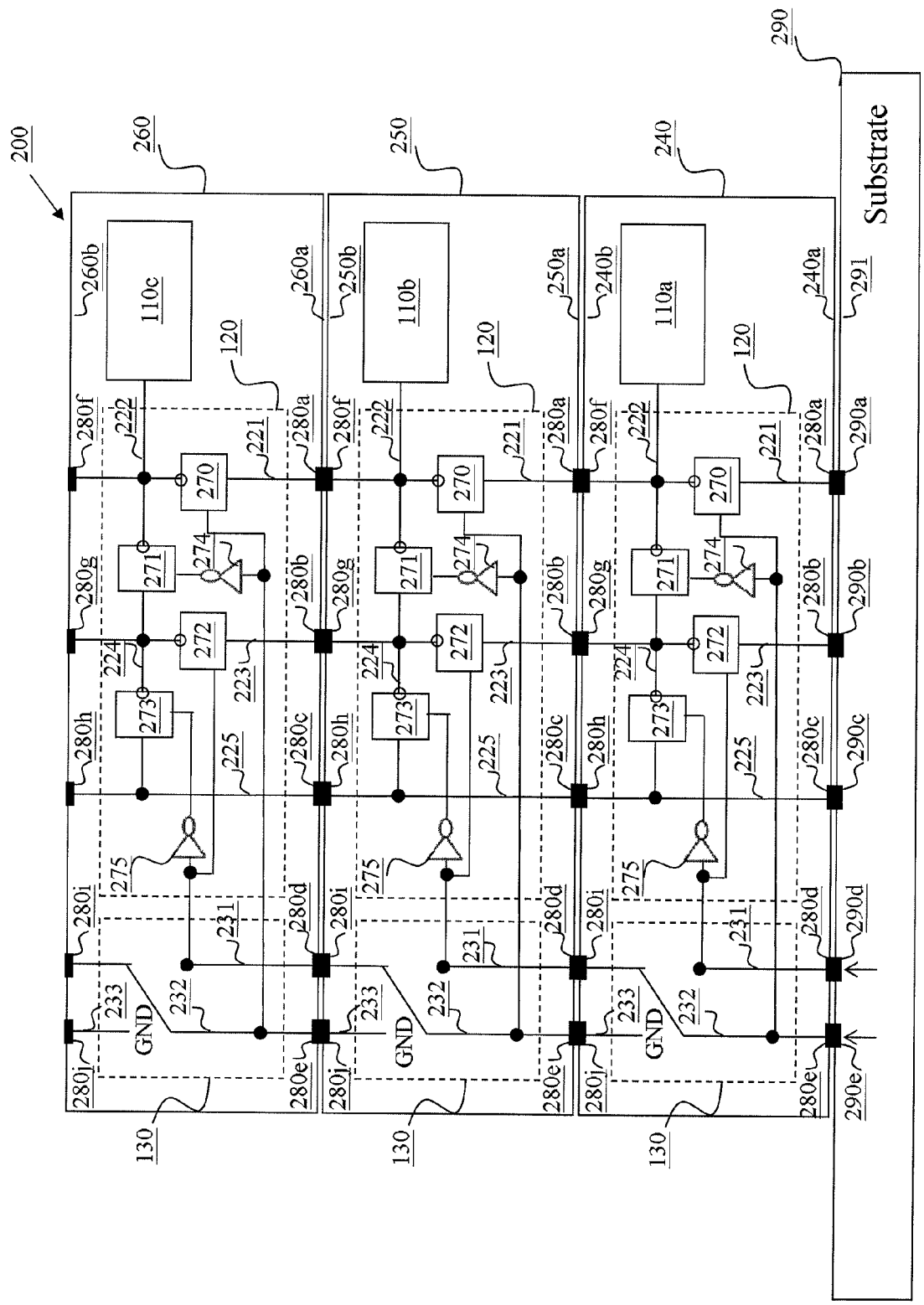
FIG. 3 is a schematic view of an integrated circuit die stack in accordance with some embodiments.

FIG. 3 sets forth a schematic view of an integrated circuit die stack 200 according to an example embodiment of the present work. The die stack 200 includes substrate 290, first stacked die 240, second stacked die 250, and third stacked die 260. The dies 240, 250 and 260 are similar to the die 100 in FIG. 2A. In some embodiment, all the dies 240, 250 and 260 may contain similar functional circuitries 110a, 110b and 110c. However, it is understood that the functional circuitry in each of the dies can be different, as long as input/output contact assignments (contact maps) of each of the dies are compatible.

The contacts at the surface 240a of the die 240 connect to the contacts at the surface 291 of the substrate 290. The contacts at the surface 240b of the die 240 connect to the contacts at the surface 250a of the die 250. The contacts at the surface 250b of the die 250 connect to contacts at the surface 260a of the die 260. The contacts at the adjacent surfaces of dies are one-to-one connected. For example, the $k^{th}$ contact at the surface 240b of the die 240 is connected to the $k^{th}$ contact at the surface 250a of the die 250 for K=1 to 5 in FIG. 3. Two contacts may be coupled together to make a physical connection. One of ordinary skill in the art would understand a variety of means and materials may be used to make the physical connection, for example, two contacts may be coupled together through solder balls, copper pillar bump or the like.

Contacts 290d and 290e may be connected to a logical high voltage, such as VDD, or may be electrically connected to the FSM or the control circuitry (not shown) to provide the logical high level. The logical high level on the contact 290e is transmitted to the contact 280i of the die 240 through the contact 280e and the electrical connection 232 of the die 240. In consequence the corresponding logical levels are transmitted to the electrical ports 36 shown in FIG. 2B of the programmable connection elements 270 and 271 of the die 240. Accordingly, the programmable connection element 270 of the die 240 is activated but the programmable connection element 271 of the die 240 is disabled. As a result, the signal route from the contact 290a is electrically connected to the functional circuitry 110a of the die 240. The logical high level is also applied on the contact 290d. In consequence, the corresponding logical levels are transmitted to the electrical port 36 of the programmable connection elements 272 and 273 of the die 240. Accordingly, the programmable connection element 272 of the die 240 is activated but the programmable connection element 273 of the die 240 is disabled. As a result, the signal route from the contact 290b is electrically connected to the contact 280g of the die 240. The signal route from the contact 290c is electrically connected to the contact 280h of the die 240. The contact 280j of the die 240 is connected to a logical low voltage, such as ground voltage, through the electrical connection 233 of the die 240.

The logical low level on the contact 280j of the die 240 is transmitted to the contact 280i of the die 250 through the contact 280e and the electrical connection 232 of the die 250. In consequence, the corresponding logical levels are transmitted to the electrical ports 36 shown in FIG. 2B of the programmable connection elements 270 and 271 of the die 250. Accordingly, the programmable connection element 270 of the die 250 is disabled but the programmable connection element 271 of the die 250 is activated. As a result, the signal route from the contact 280f of the die 240 will not be connected to the functional circuitry 110b of the die 250. The logical level on the contact 280i of the die 240 is high. In consequence, the corresponding logical levels are transmitted to the electrical port 36 shown in FIG. 2B of the programmable connection elements 272 and 273 of the die 250. Accordingly, the programmable connection element 272 of the die 250 is activated but the programmable connection element 273 of the die 250 is disabled. As a result, the signal route from the contact 280g of the die 240 is electrically connected to the functional circuitry 110b of the die 250. The signal route from the contact 280h of the die 240 is also electrically connected to the contact 280h of the die 250. The contact 280j of the die 250 is connected a logical low voltage, such as ground voltage, through the electrical connection 233 of the die 250.

The logical low level on the contact 280j of the die 250 is transmitted to the contact 280i of the die 260 through the contact 280e and the electrical connection 232 of the die 260. In consequence, the corresponding logical levels are transmitted to the electrical ports 36 shown in FIG. 2B of the programmable connection elements 270 and 271 of the die 260. Accordingly, the programmable connection element 270 of the die 260 is disabled but the programmable connection element 271 of the die 260 is activated. As a result, the signal route from the contact 280f of the die 250 will not be connected to the functional circuitry 110c of the die 260. The logical level on the contact 280i of the die 250 is low. In consequence, the corresponding logical levels are transmitted to the electrical port 36 shown in FIG. 2B of the programmable connection elements 272 and 273 of the die 260. Accordingly, the programmable connection element 272 of the die 260 is disabled but the programmable connection element 273 of the die 260 is activated. As a result, the signal route from the contact 280h of the die 250 is electrically connected to the functional circuitry 210 of the die 260.

The electrical connections in all dies 240, 250 and 260 can be metal wires, vias, TSVs, or any other conductive means. Although, in FIG. 3, each of the dies 240, 250 and 260 only show a small numbers of contacts, programmable connection elements and electrical connection, it is understood that this is for ease of illustration, and other number of them can be deployed in accordance with the functionality requirements of the die stack.

Figure 4:
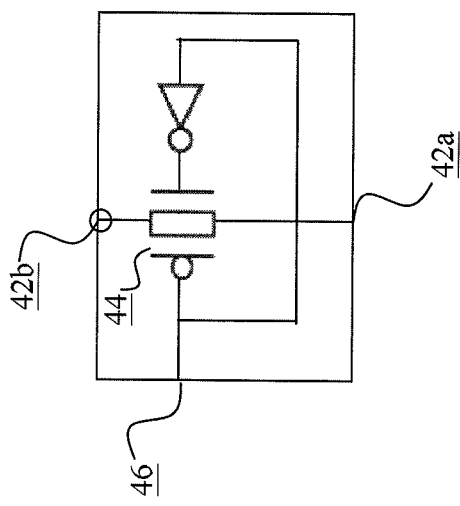
FIG. 4 is another schematic view of a programmable connection element in accordance with some embodiments.
Figure 5:
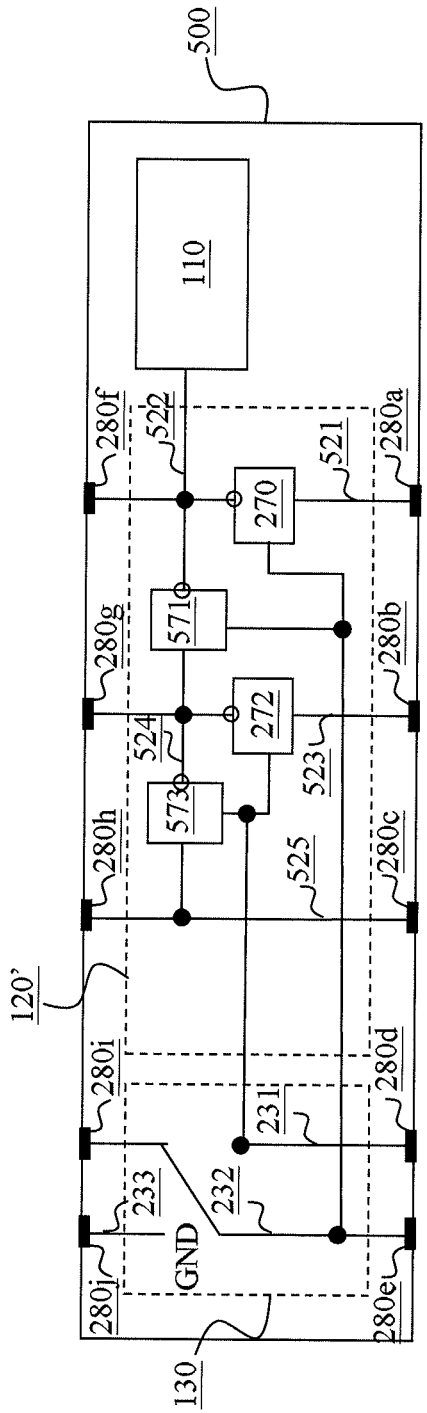
FIG. 5 is a simplified schematic view of an integrated circuit die in accordance with some embodiments.

Referring again to FIG. 2A, the programmable connection elements 271 and 273 and the corresponding inverters 274 and 275 in the die 100 can be merged to be a more simplified circuit as shown in FIG. 4 according to an example embodiment of the present work. In FIG. 4, a transmission gate 44 is used to connect electrical ports 42a and 42b, with a switch controlled from an electrical port 46. The programmable connection element in FIG. 4 is activated to electrically connect the electrical port 42a to the electrical port 42b when the electrical port 46 received a logical low voltage, for example a ground voltage. The programmable connection element in FIG. 4 is disabled to electrically disconnect the electrical port 42a from the electrical port 42b when the electrical port 46 received a logical high voltage, for example an operation voltage. In this way, the programmable array 120 of the die 100 in FIG. 2A can be simplified as a programmable array 120' of integrated circuit die 500 shown in FIG. 5 according to an example embodiment of the present work. In a programmable array 120' of FIG. 5, programmable connection elements 270 and 272 use the circuit shown in FIG. 2B, but programmable connection elements 571 and 573 use the circuit shown in FIG. 4. For clarity, ports indicated by a circle for programmable connection elements 571 and 573 in FIGS. 5, 6 and 7 correspond to port 42b shown in FIG. 4, ports positioned on opposite side of programmable connection elements 571 and 573 in FIGS. 5, 6, and 7 correspond to port 42a shown in FIG. 4 and the remaining port corresponds to port 46 shown in FIG. 4. As a result, signal route from a contact 280d is electrically connected to the electrical port 36 shown in FIG. 2B of the programmable connection element 272 and to the electrical port 46 shown in FIG. 4 of the programmable connection element 573 through an electrical connection 231. Signal route from a contact 280e is electrically connected to the electrical port 36 shown in FIG. 2B of the programmable connection element 270 and to the electrical port 46 shown in FIG. 4 of the programmable connection element 571 through an electrical connection 232.

Figure 6:
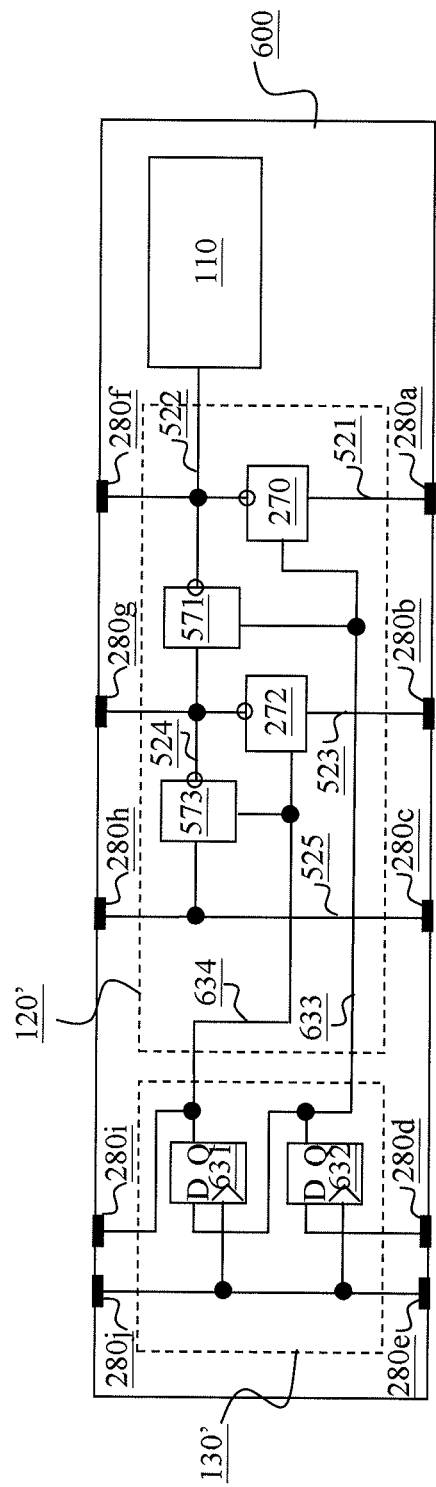
FIG. 6 illustrates a schematic view of a programmable array control unit in an integrated circuit die in accordance with some embodiments.

FIG. 6 diagrammatically illustrates an alternative circuit for a programmable array control unit 130' according to an example embodiment of the present work. In the programmable array control unit 130', two flip-flops 631 and 632 are connected in a serial manner; that is, a Q output of the flip-flop 632 is connected to a D input of the flip-flop 631. It is understood by one of ordinary skill in the art that these two flip-flops may be connected in parallel manner (not shown here). Although there are two flip-flops used in this example, it is understood that it is for ease of illustration and the number of the flip-flops may be depend on the functionality requirements of the die stack. Also, it is understood by any one of ordinary skill in the art that other electrical circuits can be used to replace the flip-flops 631 and 632, such as latches, memories or the like.

A clock signal is applied on a contact 280e and then electrically connected to a clock input of the flip-flops 631 and 632. The serial data is applied on a contact 280d and then electrically connected to a D input of the flip-flop 632. The Q output of the flip-flop 631 is electrically connected to a contact 280i to transmit serial data to neighboring die in the die stack. The clock and serial data may be generated by the FSM or the control circuitry. In a first generated clock cycle, a first generated serial data is captured and stored in the flip-flop 632. In a second generated clock cycle, the first generated serial data is captured and stored in the flip-flop 631 and a second generated serial data is captured and stored in the flip-flop 632. The Q output of the flip-flop 632 is electrically connected to the electrical port 36 shown in FIG. 2B of the programmable connection element 270 and to the electrical port 46 of the programmable connection element 571 through an electrical connection 633. Also, the Q output of the flip-flop 631 is electrically connected to the electrical port 36 of the programmable connection element 272 and to the electrical port 46 shown in FIG. 4 of the programmable connection element 573 through an electrical connection 634.

Figure 7:
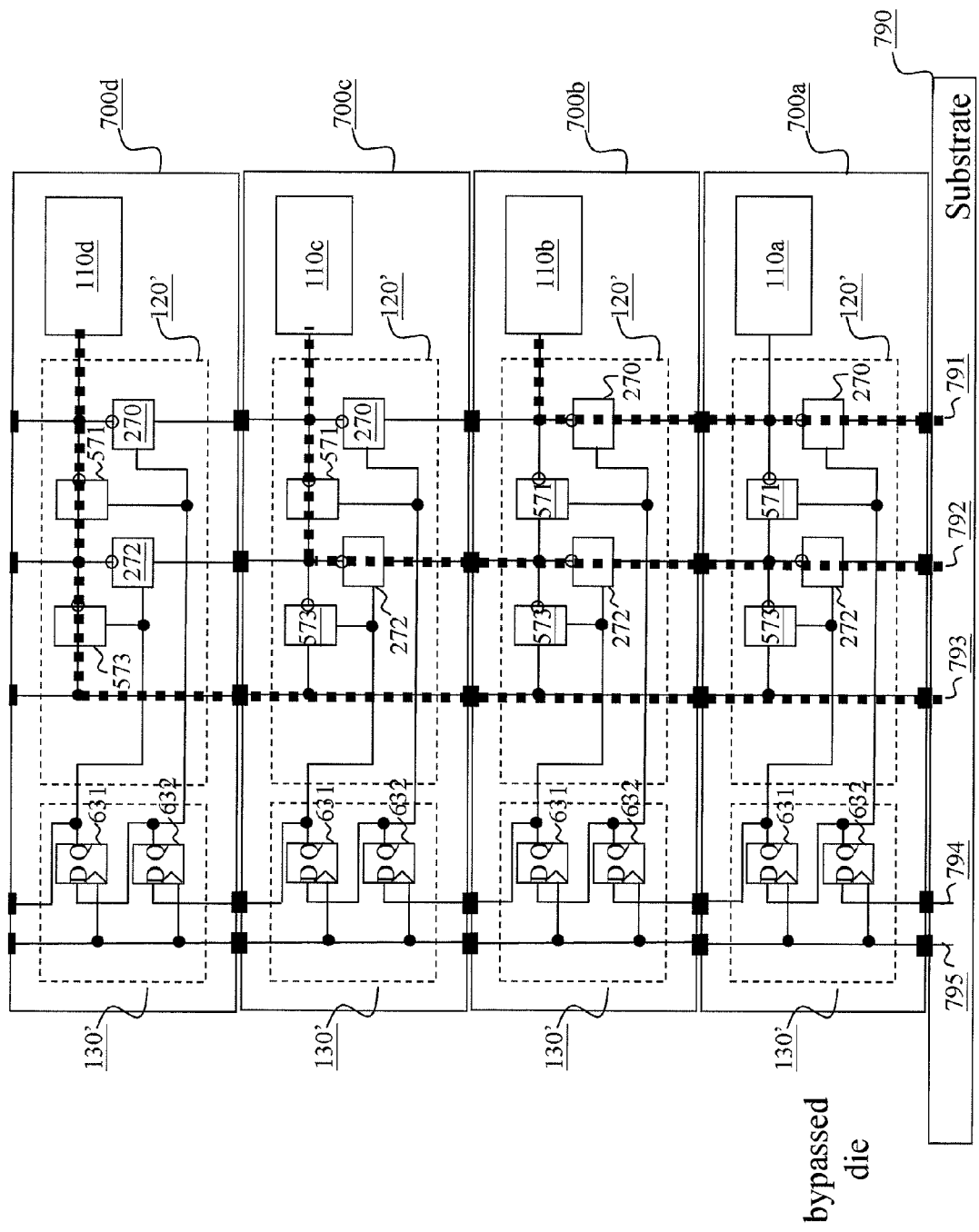
FIG. 7 illustrates signal routes to corresponding functional circuitry in stacked-die architecture to bypass a die in accordance with some embodiments.

FIG. 7 diagrammatically illustrates the signal routes to corresponding functional circuitry in stacked-die architecture to bypass a die according to an example embodiment of the present work. Although only one die is bypassed in this embodiment, it is understood that more than one die can be bypassed depending on the yield requirements of the die stack. Dies 700a, 700b, 700c and 700d have the same contact map and are similar to the die 600 illustrated in FIG. 6, and are stacked upon one another and upon a substrate 790. Initially, a die combination (700a, 700b, 700c) is for designated functional operations, and the die 700d is a redundant die existed to be an alternative die in order to achieve a better yield rate and product life time. In FIG. 7, although the redundant die is stacked on top of all dies, it is understood that this is for ease of illustration; the redundant die may be integrated in any position of the stacked dies.

In FIG. 7, the die 700a is a failed die, and it may be tested and identified as a failed die by an on-die Build-In Self Test (BIST) or specific circuits that are triggered by software commands. The on-die BIST or specific circuits are designed to be electrically connected to the functional circuitry in each corresponding dies. Upon identifying a failed die, the BIST or specific circuits in the corresponding die generates a die bypassing signal and transmit the signal to the FSM or the control circuitry. The FSM or the control circuitry then triggers the programmable array control unit in each die to program the corresponding programmable array based on the received die bypassing signals. That is, the FSM or the control circuitry generate the clock signal and transmit signal 795, and generate a serial data {0, 0, 1, 0, 1, 1, 1, 1} and transmit (MSB first) signal 794. As a result, the die combination for the functional operations is changed from (700a, 700b, 700c) to (700b, 700c, 700d) to bypass the die 700a and use the redundant die 700d. In consequence, a signal route 791 is electrically connected to a functional circuitry 110b of the die 700b. A signal route 792 is electrically connected to a functional circuitry 110c of the die 700c. And a signal route 793 is electrically connected to a functional circuitry 110d of the die 700d.

Referring again to FIG. 7, to bypass the die 700b, the serial data that is generated and transmitted as the signal 794 is {0, 0, 1, 0, 1, 0, 1, 1}; Similarly, to bypass the die 700c, the serial data that is generated and transmitted as the signal 794 is {0, 0, 0, 0, 1, 0, 1, 1}

In some embodiments, the decision to bypass dies may be base on the functional, speed and power consumption requirement of the die stack. The stacked redundant dies in a die stack may be similar to the other dies in the die stack except for functional circuitries. For example, in FIG. 7, the functional circuitries 710a, 710b and 710c contain 1 M bits memory. But the functional circuitry 710d contains 16 M bits memory. The die combination for the audio operations is (700a, 700b, 700c) to use smaller volume of memory in order to save operating power. When video operations are launched, the die combination have to change from (700a, 700b, 700c) to (700b, 700c, 700d) to meet application operation requirements. In this case, the die bypassing signals are generated, for example, by a memory mapped register that is readable and writeable by a Central Processing Unit (CPU). Upon receiving video operations request, the CPU writes to the memory mapped register to generate the corresponding die bypassing signals to change the die combination from (700a, 700b, 700c) to (700b, 700c, 700d). Upon receiving audio operations request, the CPU also writes to the memory mapped register to generate the corresponding die bypassing signals to change the die combination from (700b, 700c, 700d) to (700a, 700b, 700c).

All of the serial data used to be transmitted to the signal 794 may be stored in a table and accessed through a table lookup function. The flow to bypass specific dies in the die stack may be launched during reset period, or any designated period of time that will not affect the correct functional operations of whole system.

Figure 8:
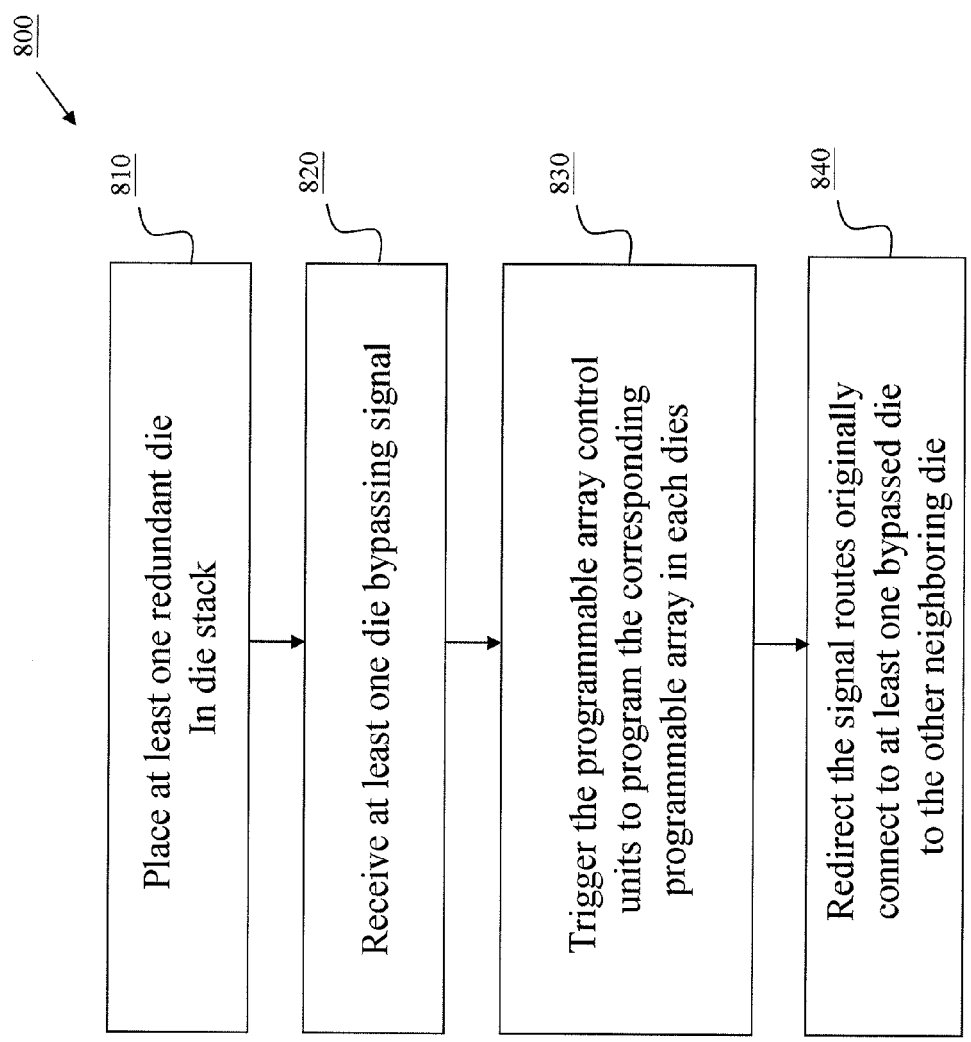
FIG. 8 is a flow chart of a method to bypass dies in a die stack in accordance with some embodiments.

FIG. 8 is a process flow 800 of a method to bypass specific dies in a die stack such as one shown in FIG. 7 in accordance with some embodiments.

At operation 810, in packaging stage, at least one redundant die is placed in a die stack on a substrate at any position that meets functional and package requirements. The number of redundant dies that are integrated into the stacked dies depends on function, reliability, yield and customer requirements. The redundant dies may be similar to the other dies except for the functional circuitry. For example, the functional circuitry of one redundant die contains a higher volume of memory than one of the other dies. Yet in other embodiment, the functional circuitry of the redundant die contains a lower volume of memory than one of the other dies.

At operation 820, at least one die bypassing signal is transmitted to the FSM or the control circuitry located in the substrate or in other dies stacked on the substrate. The die bypassing signal may be generated by corresponding on-die BISTs or specific circuits after identifying failed dies. In other embodiments, the die bypassing signal may be generated based on functional, speed and power consumption requirements of the die stack.

At operation 830, after receiving the at least one die bypassing signal, the FSM or the control circuitry triggers the programmable array control units to program the corresponding programmable array in each die to bypass specific dies.

At operation 840, the signals routes originally being connected to the functional circuitry of at least one bypassed die are redirected to the functional circuitry of the other neighboring die.

The embodiments described provide connection structures for dies in an integrated circuit die stack. Each die in the die stack includes a functional circuitry, a programmable array and a programmable array control unit. By triggering the programmable array control unit to program corresponding programmable array in each die of the die stack, signal routes are orchestrated to connect to corresponding functional circuitry in each die of the die stack to enable the entire die stack to meet functional goals. In addition, specific die(s) in the die stack may be bypassed by issuing control command to the programmable array control unit. Die(s) may be bypassed to meet functional goals and to improve yield, and reliability.

One aspect of this description relates to an integrated circuit die stack, comprises a first die and a second die connected to each other. Each of the first and second dies comprise a functional circuitry, a plurality of first contacts on a first surface of the respective die, a plurality of second contacts on a second surfaces of the respective die, and a programmable array coupled to the functional circuitry and the plurality of first and second contacts. The programmable array includes a plurality of programmable connection elements in the first and second dies. The programmable connection elements are programmed to bypass one of the first and second dies.

Another aspect of this description relates to an integrated circuit die that comprises a functional circuitry, a plurality of first contacts on a first surface of the integrated circuit die, a plurality of second contacts on a second surface of the integrated circuit die, and a programmable array including a plurality of connection elements coupled to the functional circuitry and the plurality of first and second contacts. The integrated circuit die also comprises a programmable array control unit coupled to the programmable array. The programmable array control unit is configured to program the programmable array to connect at least two of the plurality of first contacts, the plurality of second contacts and the functional circuitry.

Still another aspect of this description relates to a method of bypassing at least one die in an integrated circuit die stack. The method comprises placing at least one redundant die in the integrated circuit die stack. The method also comprises receiving at least one die bypassing signal. The method further comprises triggering programmable array control units to program the corresponding programmable array in each die. The method additionally comprises redirecting signal routes originally connected to at least one bypassed die to the other neighboring die.

What is claimed is:

1. An integrated circuit die stack, comprising:
    a first die connected to a second die, each of the first and second dies comprising:
       a functional circuitry;
       a plurality of first contacts on a first surface of the respective die;
       a plurality of second contacts on a second surface of the respective die;
       a programmable array coupled to the functional circuitry and the plurality of first and second contacts, the programmable array including a plurality of programmable connection elements in the first and second dies; and
       a programmable array control unit coupled to the programmable array, the programmable array control unit being configured to program the programmable array to connect at least two of the plurality of first contacts, the plurality of second contacts and the functional circuitry,
    wherein the programmable connection elements are programmed to bypass the first die or the second die.

2. The integrated circuit die of claim 1, wherein the programmable array control unit controls the programmable array by either activating or disabling each of the plurality of programmable connection elements.

3. The integrated circuit die of claim 2, wherein the programmable array control unit comprises logic to perform logical and/or arithmetic operations on signals from input contacts on the first surface, and output operation results to output contacts on the second surface.

4. The integrated circuit die of claim 1, wherein each programmable connection element of the plurality of programmable connection elements comprises at least one input port, one output port, and one switch control.

5. The integrated circuit die of claim 1, wherein the plurality of first contacts includes a quantity of first contacts equal to a quantity of second contacts included in the plurality of the second contacts.

6. An integrated circuit die, comprising:
    a functional circuitry;
    a plurality of first contacts on a first surface of the integrated circuit die;
    a plurality of second contacts on a second surface of the integrated circuit die; and
    a programmable array including a plurality of connection elements coupled to the functional circuitry and the plurality of first and second contacts; and
    a programmable array control unit coupled to the programmable array, the programmable array control unit being configured to program the programmable array to connect at least two of the plurality of first contacts, the plurality of second contacts and the functional circuitry.

7. The integrated circuit die stack of claim 6, wherein the programmable array control unit is one of a first programmable array control unit and a second programmable array control unit, the first die comprises the first programmable array control unit, and the second die comprises the second programmable array control unit, the first and second programmable array control units being coupled to a corresponding programmable array for controlling the corresponding programmable array by either activating or disabling each of the plurality of programmable connection elements.

8. The integrated circuit die of claim 7, wherein the first programmable array control unit and the second programmable array control unit comprise logic to perform logical and/or arithmetic operations on signals from input contacts on the first surface in each of the first and second dies, and output operation results to output contacts on the second surface in each of the first and second dies.

9. The integrated circuit die of claim 6, wherein each programmable connection element of the plurality of programmable connection elements in the programmable array of the first and second dies comprises at least one input port, one output port, and one switch control.

10. The integrated circuit die stack of claim 6, wherein each of the first and second dies further comprise:
    N input contacts of the plurality of first contacts, coupled to the programmable array, labeled with a value k that runs from 1 to N, where $N > 1$;
    N output contacts of the plurality of second contacts, coupled to the programmable array, labeled with a value k that runs from 1 to N; and
    wherein the input contact labeled k on the second die is coupled to the output contact labeled k on the first die for $k = 1$ to N.

11. The integrated circuit die stack of claim 6, further comprising:
    M input contacts of the plurality of first contacts, coupled to the programmable array control unit, labeled with a value j that runs from 1 to M, where $M > 1$;

M output contacts of the plurality of second contacts, coupled to the programmable array control unit, labeled with a value j that runs from 1 to M; and wherein the input contact labeled j on the second die is coupled to the output contact labeled k on the first die for j =1 to M.

12. The integrated circuit die stack of claim 6, wherein the plurality of the first contacts includes a quantity of first contacts equal to a quantity of second contacts included in the plurality of the second contacts.

13. The integrated circuit die stack of claim 6, wherein the first die and the second die have the same contact map.

14. The integrated circuit die stack of claim 6, wherein one of the functional circuitry in the first and second dies contains a smaller volume of memory; and wherein the plurality of programmable connection elements of the programmable array in the first and second dies being programmed to bypass one of the first and second dies based on functional, speed and power consumption requirements.

15. A method of bypassing at least one die in an integrated circuit die stack comprising:
    placing at least one redundant die in the integrated circuit die stack;
    receiving at least one die bypassing signal;
    triggering programmable array control units in each die of the integrated circuit die stack to program a corresponding programmable array in each die; and
    redirecting signal routes originally connected to at least one bypassed die to another die.

16. The method of claim 15, wherein the at least one die bypassing signal is generated by on-die Build-In Self Test (BIST) or specific logic, triggered by software commands, that is electrically connected to a functional circuitry in a corresponding die.

17. The method of claim 15, wherein the at least one die bypassing signal is generated based on functional, speed and power consumption requirements.

18. The method of claim 15, wherein the programmable array control unit in each of the stacked dies comprises logic to perform logical and/or arithmetic operations on signals from input contacts in a corresponding one of the stacked dies, and output operation results to output contacts in the corresponding one of the stacked dies.

19. The method of claim 15, wherein all of the stacked die have the same contact map.

20. The method of claim 15, wherein the redundant die is similar to the other stacked dies except for functional circuitries.

21. An integrated circuit die stack, comprising:
    a first die connected to a second die, each of the first and second dies comprising:
        a functional circuitry;
        a plurality of first contacts on a first surface of the respective die;
        a plurality of second contacts on a second surface of the respective die; and
        a programmable array coupled to the functional circuitry and the plurality of first and second contacts, the programmable array including a plurality of programmable connection elements in the first and second dies,
    wherein the programmable connection elements are programmed to isolate the functional circuitry from a neighboring die.

* * * * *